(12) United States Patent
Sheng et al.

(10) Patent No.: US 12,727,486 B2
(45) Date of Patent: Sep. 1, 2026

(54) WAFER MATCHING DESIGN METHOD, WAFER BONDING STRUCTURE AND CHIP BONDING STRUCTURE

(71) Applicant: WUHAN XINXIN SEMICONDUCTOR MANUFACTURING CO., LTD., Wuhan (CN)

(72) Inventors: Beibei Sheng, Wuhan (CN); Sheng Hu, Wuhan (CN); Tianjian Liu, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 744 days.

(21) Appl. No.: 18/025,290

(22) PCT Filed: Oct. 27, 2020

(86) PCT No.: PCT/CN2020/124162

§ 371 (c)(1),
(2) Date: Mar. 8, 2023

(87) PCT Pub. No.: WO2022/062045

PCT Pub. Date: Mar. 31, 2022

(65) Prior Publication Data

US 2023/0335504 A1 Oct. 19, 2023

(30) Foreign Application Priority Data

Sep. 28, 2020 (CN) ......................... 202011042851.4

(51) Int. Cl.
*H10W 46/00* (2026.01)
*H10B 80/00* (2026.01)
(Continued)

(52) U.S. Cl.
CPC ............ *H10W 46/00* (2026.01); *H10B 80/00* (2023.02); *H10W 90/00* (2026.01);
(Continued)

(58) Field of Classification Search
None
See application file for complete search history.

(56) References Cited

U.S. PATENT DOCUMENTS

2011/0115057 A1 5/2011 Harn et al.
2015/0262890 A1* 9/2015 Mizutani ............... H01L 23/544 438/5

(Continued)

FOREIGN PATENT DOCUMENTS

CN 102063015 A 5/2011
CN 102629601 A 8/2012

(Continued)

*Primary Examiner* — Julio J Maldonado
*Assistant Examiner* — Pinaki Das
(74) *Attorney, Agent, or Firm* — MUNCY, GEISSLER, OLDS & LOWE, P.C.

(57) ABSTRACT

A method of design for matching of wafers, a wafer bonding structure and a chip bonding structure includes: providing a first wafer including unit arrays that each include at least two first dies; providing a second wafer including second dies that each cover at least one of the unit arrays, and the second dies matched in terms of performance with the first dies in the unit arrays that it covers. The first and second wafers are provided with corresponding alignment marks. With this application, two or more wafers with corresponding dies differing considerably in terms of shape or area can be designed to match each other and become suitable to be bonded together. This enables effective area utilization of, and better matching in terms of area and performance
(Continued)

between, the dies, greatly shortens the development time of new products and adds great diversity and freedom to product design.

11 Claims, 4 Drawing Sheets

(51) Int. Cl.
*H10W 90/00* (2026.01)
*H10W 90/20* (2026.01)

(52) U.S. Cl.
CPC .......... *H10W 46/301* (2026.01); *H10W 90/20* (2026.01); *H10W 90/284* (2026.01)

(56) References Cited

U.S. PATENT DOCUMENTS

| | | | | |
|---|---|---|---|---|
| 2017/0084595 | A1* | 3/2017 | Seddon | H10F 39/011 |
| 2017/0352564 | A1 | 12/2017 | Lee et al. | |
| 2020/0365481 | A1* | 11/2020 | England | H01L 24/29 |

FOREIGN PATENT DOCUMENTS

| | | | |
|---|---|---|---|
| CN | 103985648 | A | 8/2014 |
| CN | 104249992 | A | 12/2014 |
| CN | 206293436 | U | 6/2017 |
| CN | 109411449 | A | 3/2019 |
| JP | 2001274073 | A | 10/2001 |
| JP | 2015-173179 | | 10/2015 |

* cited by examiner

WAFER MATCHING DESIGN METHOD, WAFER BONDING STRUCTURE AND CHIP BONDING STRUCTURE

TECHNICAL FIELD

The present invention pertains to the field of integrated circuit fabrication technology, and relates in particular to a method of design for matching of wafers, a wafer bonding structure and a chip bonding structure.

BACKGROUND

Driven by the demand for semiconductor devices with higher integration, semiconductor technology is developing toward increasing integration of dies. Wafer-level stacking based on 3D-IC technology enables cheaper, faster, denser integration of dies.

In traditional 3D-IC technology, two wafers to be vertically bonded were generally required to contain dies or exposure units in one-to-one correspondence. Moreover, in consideration of production cost and yield of the dies to be bonded, it was generally required that the dies on the upper wafer match in size the respective corresponding dies on the lower wafer (e.g., with an area difference of up to 10%), and a larger area difference would lead to a considerable waste of effective wafer area.

Currently, when two or more wafers are to be bonded together in such one-to-one correspondence, dies on the multiple wafers would constrain one another in terms of are and shape. Such constraints would not only hinder the development of 3D-IC technology toward lower power consumption, higher performance and the like, but would also lead to wasting of effective wafer area.

Further, since a complete match of two wafers to be bonded in terms of computing speed, storage capacity and the like is generally difficult to attain, tradeoffs would typically have to be made during design between wafer performance and die area, which will lead to compromises in performance or area of the bonded wafers.

SUMMARY OF THE INVENTION

It is an objective of the present invention to provide a method of design for matching of wafers, a wafer bonding structure and a chip bonding structure, which can develop a design for matching of two or more wafers containing relatively large shape or area differences and thus making them suitable to be bonded together.

The present invention provides a method of design for matching of wafers, including:

- providing a first wafer including at least one unit array each including at least two first dies;
- providing a second wafer including at least one second die each covering at least one of the unit array(s) and each matched in terms of performance with at least one of the first dies in the unit array(s) that it covers,
- wherein the first wafer is provided thereon with first alignment marks, the second wafer is provided thereon with second alignment marks, the first alignment marks correspond to the second alignment marks.

Additionally, the first wafer may include a plurality of identical first exposure units each including at least one of the unit array(s), wherein the second wafer includes a plurality of identical second exposure units each including at least one of the second die(s).

Additionally, the first alignment marks may include first overlay marks and first bonding marks, wherein: the second alignment marks include second overlay marks and second bonding marks; at least two of the first alignment marks are provided on the first wafer, and at least two of the second alignment marks are provided on the second wafer; and at least two of the second bonding marks correspond to two of the first bonding marks.

Additionally, the first exposure units may be sized the same as the second exposure units.

Additionally, those of the second overlay marks in each of the second exposure units may correspond to those of the first overlay marks in the one of the first exposure units covered by the specific second exposure unit.

Additionally, the first exposure units may be sized differently from the second exposure units.

Additionally, some of the second overlay marks in the plurality of second exposure units may correspond to some of the first overlay marks in the plurality of first exposure unit periodically or at intervals.

Additionally, those of the second overlay marks in odd-numbered ones of the second exposure units may correspond to those of the first overlay marks in first wafer regions covered by the odd-numbered second exposure units.

Alternatively, those of the second overlay marks in even-numbered ones of the second exposure units may correspond to those of the first overlay marks in first wafer regions covered by the even-numbered second exposure units.

Additionally, each second die may be bonded to the unit array(s) that it covers so that they together make up a bonded unit.

Additionally, in the bonded unit, the second die may be electrically connected to the unit array(s) by bonding a metal layer on a bonding surface of the second die to a metal layer on a bonding surface of the unit array(s), or by forming through silicon vias in the second die and the unit array(s), which extend in the direction of thicknesses thereof and filling an interconnect layer in the through silicon vias.

Additionally, in each of the second exposure units, each of the second die(s) may cover N of the first dies, where N is an integer greater than or equal to 2.

Additionally, each second die may be a control die, with the first dies being implemented as memory dies.

Additionally, each second die may be provided with a test block.

Additionally, the method may further include:

- providing a third wafer including at least one third die, wherein the first wafer, the second wafer and the third wafer are bonded in the sequence set forth, each second die covers at least one of the third die(s), each of which is matched in terms of performance with at least one of the second die(s) and/or at least one of the first dies,
- wherein the third wafer is provided thereon with third alignment marks corresponding to the second alignment marks.

Alternatively, the method may further include:

- providing a third wafer including at least one third die, wherein the second wafer, the first wafer and the third wafer are bonded in the sequence set forth, each first die covers at least one of the third die(s), each of which is matched in terms of performance with at least one of the first dies and/or at least one of the second die(s),
- wherein the third wafer is provided thereon with third alignment marks corresponding to the first alignment marks.

The present invention also provides a wafer bonding structure, including:

a first wafer including at least one unit array each including at least two first dies;

a second wafer including at least one second die each covering at least one of the unit array(s) and each matched in terms of performance with at least one of the first dies in the unit array(s) that it covers, wherein the first wafer is provided thereon with first alignment marks, the second wafer is provided thereon with second alignment marks, the first alignment marks correspond to the second alignment marks, and wherein the second wafer is bonded to the first wafer.

The present invention also provides a chip bonding structure, including:

at least one unit array, and the at least one unit array including at least two first dies;

at least one second die, and the at least one second die covering the at least one unit array, wherein the at least one second die is matched in terms of performance with at least one of the first dies in the at least one unit array that the at least one second die covers, and wherein the at least one second die is boned to the at least one unit array that the at least one second die covers.

Compared with the prior art, the present invention offers the following benefits:

In the wafer matching design method, the wafer bonding structure and the chip bonding structure of the present invention, the first wafer includes unit array(s) each including at least two first dies, and the second wafer includes second die(s) each covering at least one of the unit array(s). Moreover, each second die is matched in terms of performance with the first dies of the unit array(s) that it covers, and the first wafer is provided thereon with first alignment marks, the second wafer is provided thereon with second alignment marks, the first alignment marks correspond to the second alignment marks. With the present invention, two or more wafers with corresponding dies differing considerably in terms of shape or area can be designed to match each other and become suitable to be bonded together. This enables effective area utilization of the first and second dies, and better matching in terms of area and performance between the first and second dies, greatly shortens the development time of new products and adds great diversity and freedom to product design.

Further, the second dies may be implemented as control dies, the first dies may be implemented as memory dies. This design with each control die being matched with several (≥2) memory dies enables matching of a computing speed of the control die with a storage capacity of the memory dies, facilitating the integration of storage and computing and providing an improved storage capacity.

DESCRIPTION OF REFERENCE NUMERALS IN DRAWINGS

10: First Wafer Exposure Unit; 11: Unit Array; 11*a*: First Die; 12: First Bonding Mark; 13: First Overlay Mark;

20: Second Wafer Exposure Unit; 21: Second Die; 22: Second Bonding Mark; 23: Second Overlay Mark;

30*a*: First Wafer First Exposure Unit; 30*b*: First Wafer Second Exposure Unit; 30*c*: First Wafer Third Exposure Unit; 31: Unit Array; 31*a*: First Die; 32: First Bonding Mark; 33: First Overlay Mark;

40*a*: Second Wafer First Exposure Unit; 40*b*: Second Wafer Second Exposure Unit; 40*c*: Second Wafer Third Exposure Unit; 40*d*: Second Wafer Fourth Exposure Unit; 41: Second Die; 42: Second Bonding Mark; 43: Second Overlay Mark; 44: Test Block;

51: Unit Array; 51*a*: First Die; 61: Second Die; 71: Third Die;

52: Unit Array; 52*a*: First Die; 62: Second Die; 72: Third Die.

DETAILED DESCRIPTION

In view of the foregoing description, embodiments of the present invention provide a method of design for matching of wafers, a wafer bonding structure and a chip bonding structure. The present invention will be described in greater detail below with reference to particular embodiments and the accompanying drawings. Advantages and features of the present invention will become more apparent from the following description. Note that the figures are provided in a very simplified form not necessarily drawn to exact scale and for the only purpose of facilitating easy and clear description of the embodiments.

Figure 1:
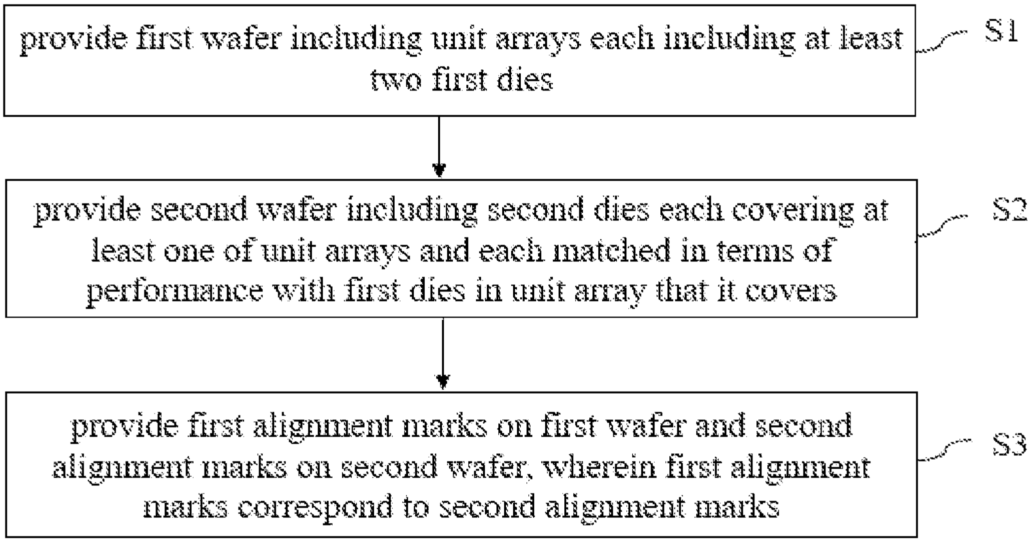
FIG. 1 is a schematic diagram showing a method of design for matching of wafers according to embodiments of the present invention.

In an embodiment of the present invention, there is provided a method of design for matching of wafers, which, as shown in FIG. 1, includes:

providing a first wafer including unit arrays, each unit array includes at least two first dies;

providing a second wafer including second dies, each second die covers at least one of the unit arrays and matched in terms of performance with the first dies in the unit array that it covers, wherein the first wafer is provided thereon with first alignment marks, the second wafer is provided thereon with second alignment marks, the first alignment marks correspond to the second alignment marks.

Each second die matches with the first dies in the unit array that it covers in terms of performance. For example, a scenario in which the second die is matched in terms of performance with each first die that it covers, and the second die is electrically connected to each first die that it covers. This is analogous to a parallel one-to-multiple connection between each second die and the first dies that it covers. Depending on the actual requirements, it is possible for the individual first dies covered by each second die to be independent on and not electrically connected to one another, or it is possible for the individual first dies covered by each second die to be dependent on and electrically connected to one another.

Alternatively, it may refer to another scenario in which each second die is matched in terms of performance with and electrically connected to only one of the first dies covered by the specific second die, the individual first dies covered by each second die are dependent on in terms of performance and electrically connected to one another. In other words, the performance of all the first dies that each second die covers have been integrated, and only one of them is selected to be matched in terms of performance with and electrically connected to the second die. This is analogous to a serial connection between each second die and the first dies that it covers.

Depending on the actual needs, other scenarios are also possible, in which each second die is matched in terms of performance with and electrically connected to some of the first dies (more than one and less than the total number) that it covers.

Figure 2:
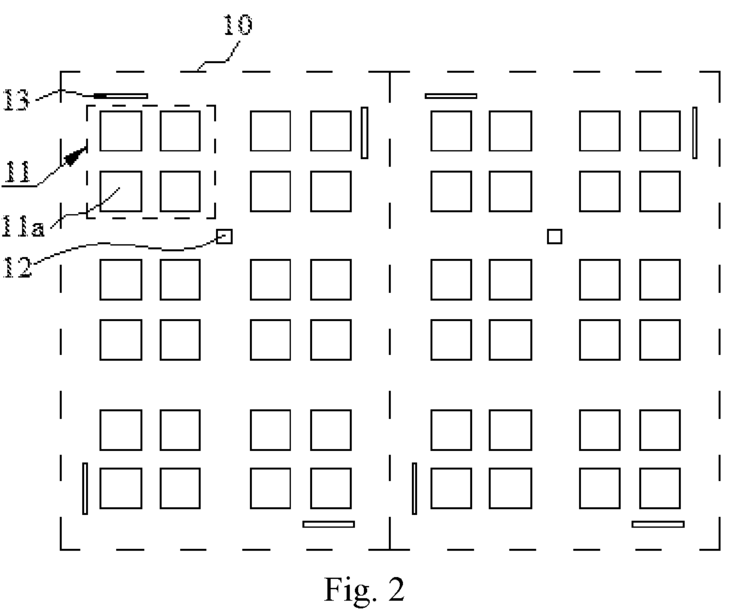
FIG. 2 is a schematic diagram of first exposure unit on a first wafer according to a first embodiment of the present invention.
Figure 3:
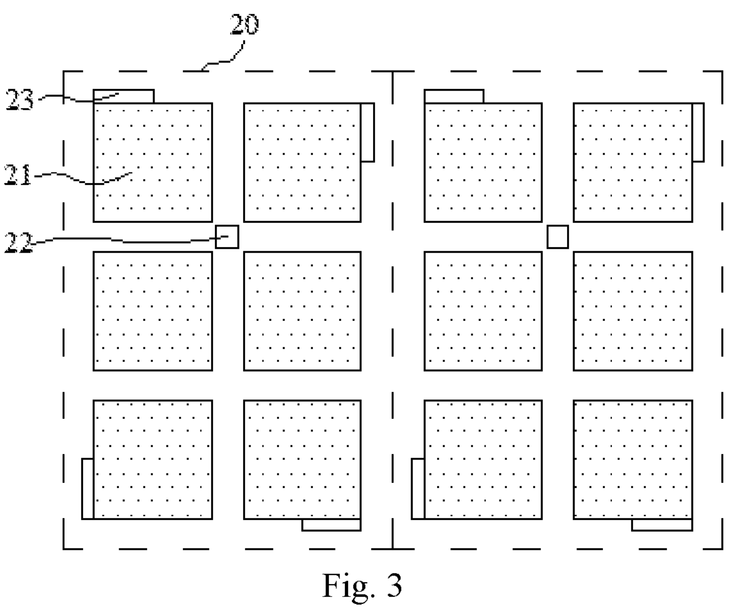
FIG. 3 is a schematic diagram of second exposure unit on a second wafer according to the first embodiment of the present invention.
Figure 4:
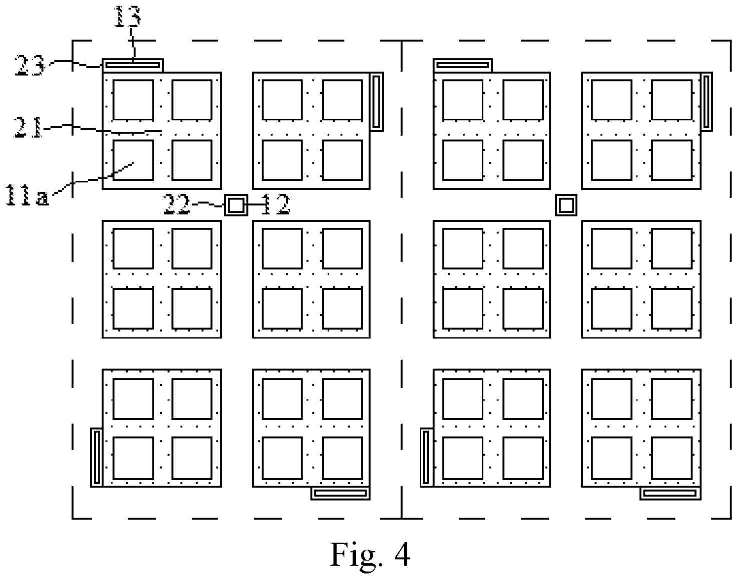
FIG. 4 is a schematic diagram of the first and second wafers in alignment with each other according to the first embodiment of the present invention.

A first embodiment in which the present invention is applied to two wafers having equally-sized exposure units will be described below with reference to FIGS. 2 to 4. FIG. 2 is a schematic diagram of first exposure units on a first wafer in the first embodiment. FIG. 3 is a schematic diagram of second exposure units on a second wafer in the first embodiment. FIG. 4 is a schematic diagram showing the first and second wafers that have been aligned with each other in the first embodiment.

As shown in FIG. 2, the first wafer is provided, the first wafer has identical first exposure units 10. The first exposure units 10 each include at least one unit array 11, each unit array 11 includes at least two first dies 11*a*.

As shown in FIGS. 2 to 4, the second wafer is provided, the second wafer has identical second exposure units 20. The second exposure units 20 each include at least one second die 21, each second die 21 covers at least one unit array 11. The first exposure units 10 are sized the same as the second exposure units 20. Each second die 21 covers N first dies 11*a*, where N is an integer that is greater than or equal to 2. For example, N may be any one of 2, 3, 4, 8, 16, 24, 36, 40 and 48, the value of N may be larger depending on the actual needs, and the present invention is not limited to any particular value of N.

The first wafer is provided thereon with first alignment marks, the first alignment marks include first overlay marks 13 and first bonding marks 12. The second wafer is provided thereon with second alignment marks, the second alignment marks include second overlay marks 23 and second bonding marks 22. At least two of the second bonding marks 22 correspond to respective two of the first bonding marks 12. The first overlay marks 13 correspond to the respective second overlay marks 23. For example, the first overlay marks 13 are arranged in dicing lanes around the corners of the first exposure units 10. For example, there are four first overlay marks 13 in each first exposure unit 10, which are arranged into a ring. Additionally, the second overlay marks 23 are arranged in dicing lanes around the corners of the second exposure units 20. For example, there are four second overlay marks 23 in each second exposure unit 20, which are arranged into a ring.

The first overlay marks 13 and the second overlay marks 23 are provided to enable overlay alignment of the first and second wafers. The first overlay marks 13 are, for example, shaped like squares or crosses. The second overlay marks 23 are shaped in correspondence with the first overlay marks 13. The first overlay marks 13 and the second overlay marks 23 may be both patterns formed by etching in dielectric or metal layers of their own corresponding wafers. The second bonding marks 22 and the first bonding marks 12 are provided to enable alignment of the first and second wafers before they are bonded together. In this process, each second die 21 is aligned with and boned to the two or more first dies 11*a* that it covers so that they together make up one bonded unit. On the second wafer, adjacent second dies 21 are spaced apart by dicing areas where the second overlay marks 23 and the second bonding marks 22 are arranged. After being bonded, the first and second wafers are diced into individual bonded units (devices) which are sized similarly to the second dies.

Preferably, any two adjacent rows of first dies 11*a* on the first wafer are spaced apart by an equal spacing, and any two adjacent columns of first dies 11*a* on the first wafer are also spaced apart by an equal spacing. In other embodiments, any two adjacent rows of first dies 11*a* on the first wafer may alternatively be spaced apart by a different spacing, depending on the actual needs. Any two adjacent columns of first dies 11*a* on the first wafer may also be alternatively spaced apart by a different spacing, depending on the actual needs.

Each second die 21 is matched in terms of die performance with the two or more first dies 11*a* that it covers. For example, the second die 21 is a control die, while the first dies 11*a* are memory dies. This design with each control die being matched with several (≥2) memory dies enables matching of a computing speed of the control die with a storage capacity of the memory dies, facilitating the integration of storage and computing. The several (≥2) memory dies provide storage means with an increased storage capacity and enhanced reading and returning capabilities, which breaks through the "memory wall" bottleneck and achieves a high capacity and a high bandwidth. Faced with the surging demand for data storage and computing, limited computing and storage capacities have become major problems for chips. In large-scale data computing applications, the reading and returning of data from and to storage means lags far behind chip frequencies, creating significant delays which affect the chips' overall performance.

In this embodiment, the first dies 11*a* are small sized, the second dies 21 are large sized. The first dies 11*a* may be designed as standard unit die, whilst the second dies 21 may be sized depending on the actual needs while taking into account matching therewith. Each second die 21 is bonded to the two or more first dies 11*a* that it covers. In this way, more first dies 11*a* can be included in each bonded unit (device), without being limited to the one-to-one correspondence of dies any longer. Through implementing the first dies 11*a* as standard unit dies, they would not need to be taken care of, and matching the second dies with them would remain the only thing to do, during design. This can greatly shorten the development time of new products and add great diversity and freedom to product design.

Figure 5:
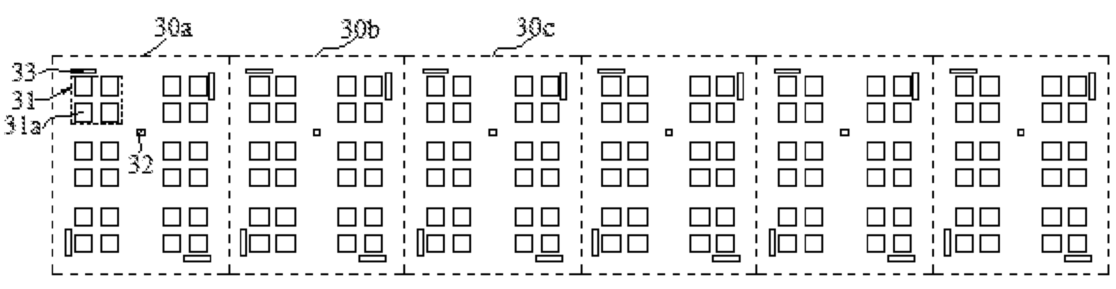
FIG. 5 is a schematic diagram of first exposure unit on a first wafer according to a second embodiment of the present invention.
Figure 6:
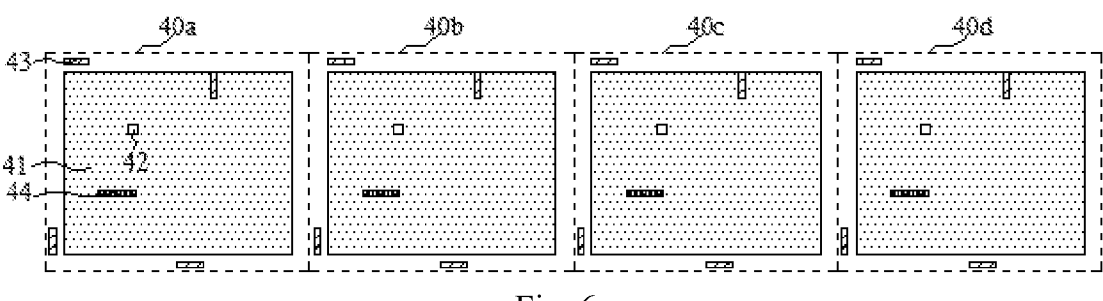
FIG. 6 is a schematic diagram of second exposure unit on a second wafer according to the second embodiment of the present invention.
Figure 7:
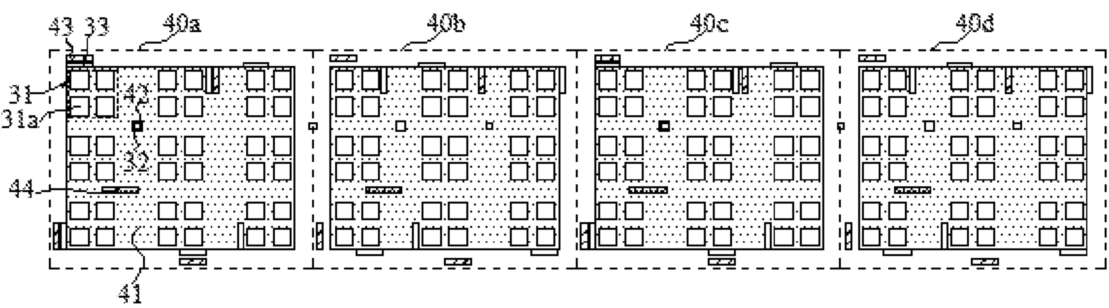
FIG. 7 is a schematic diagram of the first and second wafers in alignment with each other according to the second embodiment of the present invention.
Figure 8:
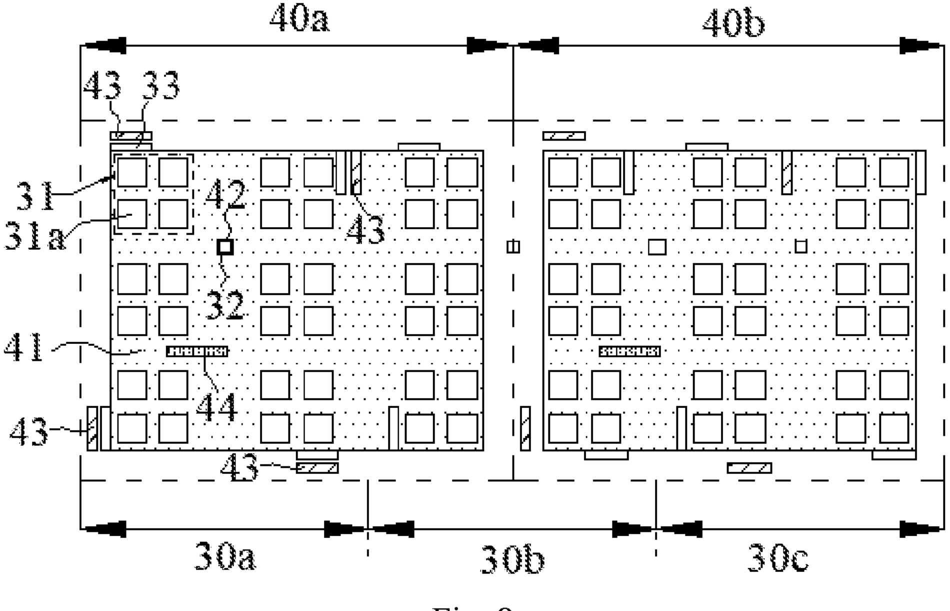
FIG. 8 is a schematic enlarged view of part of FIG. 7.
Figure 9:
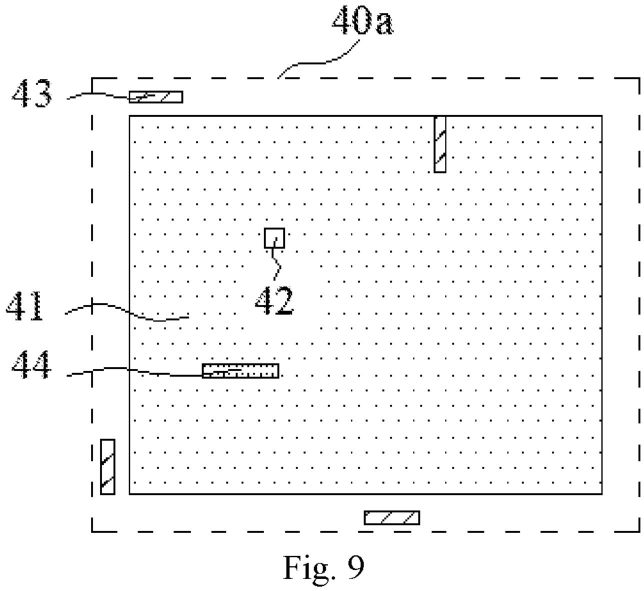
FIG. 9 is a schematic enlarged view of part of FIG. 6.

A second embodiment in which the present invention is applied to two wafers having differently-sized exposure units will be described below with reference to FIGS. 5 to 9. FIG. 5 is a schematic diagram of first exposure units on a first wafer in the second embodiment. FIG. 6 is a schematic diagram of second exposure units on a second wafer in the second embodiment. FIG. 7 is a schematic diagram showing the first and second wafers that have been aligned with each other in the second embodiment. FIG. 8 is a schematic enlarge view of part of FIG. 7. FIG. 9 is a schematic enlarge view of part of FIG. 6.

As shown in FIG. 5, the first wafer is provided, the first wafer has identical first exposure units. The first exposure units each include, for example, a first exposure unit 30*a*, a second first exposure unit 30*b* and a third first exposure unit 30*c*. Each first exposure unit includes at least one unit array 31, each unit array 31 includes at least two first dies 31*a*. Preferably, any two adjacent rows of first dies 31*a* on the first wafer are spaced apart by an equal spacing, and any two adjacent columns of first dies 31*a* on the first wafer are also spaced apart by an equal spacing. In other embodiments, any two adjacent rows of first dies 31*a* on the first wafer may alternatively be spaced apart by a different spacing, depending on the actual needs. Any two adjacent columns of first dies 31*a* on the first wafer may also be alternatively spaced apart by a different spacing, depending on the actual needs.

As shown in FIGS. 6 to 8, the second wafer is provided, the second wafer has identical second exposure units. The second exposure units each include, for example, a first second exposure unit 40*a*, a second second exposure unit 40*b*, a third second exposure unit 40*c* and a fourth second exposure unit 40*d*. Each second exposure unit includes at least one second die 41. Each second die 41 covers at least one unit array 31.

The first exposure units are sized differently from the second exposure units. Each second die 41 is aligned with and boned to the two or more first dies 31*a* that it covers so that they together make up one bonded unit. The first and second wafers are aligned and bonded with and to each other to form multiple such bonded units. In each of the bonded units, the second die 41 is aligned and matched in terms of performance with the two or more first dies 31*a* that it covers. Each second die 41 covers N first dies 31*a*, where N is an integer that is greater than or equal to 2. For example, N may be any of 2, 3, 4, 8, 16, 24, 36, 40 and 48, the value of N may be larger depending on the actual needs, and the present invention is not limited to any particular value of N.

The first wafer is provided thereon with first alignment marks, the first alignment marks include first overlay marks 33 and first bonding marks 32. The second wafer is provided thereon with second alignment marks, the second alignment marks include second overlay marks 43 and second bonding marks 42. At least two of the second bonding marks 42 on the second wafer correspond to respective two of the first bonding marks 32 on the first wafer.

Some of the second overlay marks 43 correspond to some of the first overlay marks 33 periodically or at intervals. If those of the second overlay marks in odd-numbered second exposure units correspond to those of the first overlay marks in first wafer regions covered by the odd-numbered second exposure units, then those of the second overlay marks in even-numbered second exposure units may either correspond to those of the first overlay marks in first wafer regions covered by the even-numbered second exposure units. Likewise, if those of the second overlay marks in the even-numbered second exposure units correspond to those of the first overlay marks in the first wafer regions covered by the even-numbered second exposure units, then those of the second overlay marks in the odd-numbered second exposure units may either correspond to those of the first overlay marks in the first wafer regions covered by the odd-numbered second exposure units.

As shown in FIGS. 7 to 9, for example, the second overlay marks 43 in the first second exposure unit 40*a* correspond to the first overlay marks 33 in the first wafer region covered by the first second exposure unit 40*a*. The second overlay marks 43 in the third second exposure unit 40*c* correspond to the first overlay marks 33 in the first wafer region covered by the third second exposure unit 40*c*. The second overlay marks 43 in the second exposure unit 40*b* do not correspond to the first overlay marks in the first wafer region covered by the second exposure unit 40*b*.

It is to be noted that, in this embodiment, although the second overlay marks in some of the second exposure units (e.g., 40*b* and 40*d*) do not correspond to the first overlay marks in the first wafer region covered by the second exposure units, since each second die 41 in each second exposure units (e.g., 40*a*, 40*b*, 40*c* and 40*d*) is arranged in correspondence with the several first dies 31*a* in the first wafer region that it covers, the performance of each die is not affected. As the exposure units on the first and second wafers are differently sized in order to satisfy the actual requirements of their own dies, during design, such tradeoffs for matching of the two wafers are made that some of the second overlay marks 43 (e.g., those in 40*a* and 40*c*) correspond to some of the first overlay marks 33 periodically or at intervals. In this way, not only the layout design requirements of the first and second wafers can be addressed, but also overlay alignment between them is achievable.

For example, the first overlay marks 33 are arranged in dicing lanes around the four corners of the first exposure units. For example, there are four first overlay marks 33 in each first exposure unit, which are arranged into a ring. Each first exposure unit may include three rows and two columns of unit arrays 31. Each second exposure unit may cover three such columns of unit arrays 31. The first second exposure unit 40*a* may cover both the first exposure unit 30*a* and one half of the second first exposure unit 30*b*.

In the first second exposure unit 40*a*, the second overlay marks 43 are arranged in positional correspondence with the first overlay marks 33 in the first exposure unit 30*a*. The number of the second overlay marks 43 may be for example, four, and they may be arranged into a ring. The second overlay marks 43 arranged into rings in the odd-numbered second exposure units may correspond to the first overlay marks 33 arranged into rings in the first wafer regions covered by the odd-numbered second exposure units in such a manner that the second overlay marks 43 are internally adjacent to the respective first overlay marks 33, enabling overlay alignment of the first and second wafers.

Some of the second overlay marks 43 correspond to some of the first overlay marks 33 periodically or at intervals. To this end, corresponding locations of the second wafer may be reserved for (occupation by) the second overlay marks 43, with all the internal components of the second dies being disposed on the rest of the wafer.

Additionally, test blocks 44 may be scattered in the second dies 41 on the second wafer, the test blocks 44 may be arranged at locations corresponding to first wafer locations between some of the unit arrays 31. The test blocks 44 may be provided for process monitoring.

Each second die 41 is matched in terms of performance with the two or more first dies 31*a* that it covers. For example, the second die 41 is a control die, the first dies 31*a* are memory dies. This design with each control die being matched with several (≥2) memory dies enables matching of a computing speed of the control die with a storage capacity of the memory dies, facilitating the integration of storage and computing. The several (≥2) memory dies provide storage means with an increased storage capacity and enhanced reading and returning capabilities, which breaks through the "memory wall" bottleneck and achieves a high capacity and a high bandwidth.

In this embodiment, the exposure units on the first and second wafers are differently sized in order to satisfy the actual requirements of their own dies, and the first dies 31*a* are small sized, the second dies 41 are large sized. The first dies 31*a* may be designed as standard unit die, the second dies 41 may be sized depending on the actual needs while taking into account matching therewith. Each second die 41 is bonded to the two or more first dies 31*a* that it covers. In this way, more first dies 31*a* can be included in each bonded unit (device), without being limited to the one-to-one correspondence of equally-sized dies any longer. Moreover, through implementing the first dies 31*a* as standard unit dies, they would not need to be taken care of, and matching the second dies with them would remain the only thing to do, during design. This can greatly shorten the development time of new products, lower design cost, accelerate product upgrades and add great diversity and freedom to product design.

In the first and second embodiments of the present invention, when the bonding of the first and second wafers is accomplished by wafer-level bonding, alignment of them as required by the wafer-level bonding can be achieved simply by aligning the at least two second bonding marks on the second wafer with the respective first bonding marks on the first wafer. When die-level bonding is employed, in this case, each second die is bonded to the first dies that it covers after the wafers are diced, each second die is provided with the second bonding marks and the first dies covered by the second dies are provided with respective ones of the first bonding marks.

In the first and second embodiments of the present invention, in each bonded unit (device), the electrical connection of the second die to the unit array(s) may be accomplished by two approaches, the first approach: hybrid bonding involving dielectric-dielectric bonding and metal-metal bonding between a metal layer on a bonding surface of the second die and a metal layer on a bonding surface of the unit array(s). The second approach: filling an interconnect layer in through silicon vias (TSVs) extending through the second die and the unit array(s) in the direction of their thicknesses.

In the first and second embodiments of the present invention, if the first dies (smaller dies) are fabricated by an established process that has been verified and validated, they may be taken as standard unit dies, while the second dies (larger dies) may be designed to match the first dies in accordance with the method of either of the embodiments. On the contrary, if the second dies (larger dies) are fabricated by an established process that has been verified and validated, the first dies (smaller dies) may be designed to match the first dies in accordance with the method of either of the embodiments. If both of these types of dies are newly designed ones, then may be designed to match each other in accordance with the method of either of the embodiments.

Figure 10:
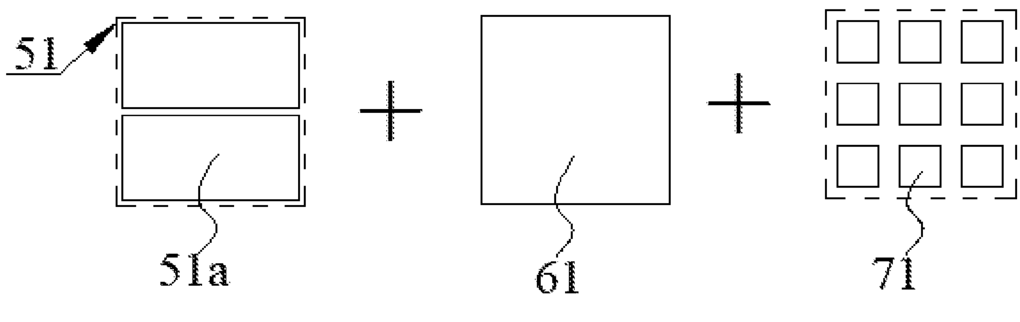
FIG. 10 is a schematic diagram showing a first example of matching three wafers according to an embodiment of the present invention.

The present invention is also applicable to design for matching and bonding of more wafers (i.e., three or more wafers). The newly added wafer may be designed to match the first dies on the first wafer or the second dies on the second wafer. FIG. 10 is a schematic diagram showing a first example of matching three wafers according to an embodiment of the present invention. As shown in FIG. 10, a method of design for matching of the wafers includes:

providing a first wafer, the first wafer includes unit arrays 51, each unit array 51 includes at least two first dies 51*a*;

providing a second wafer, the second wafer includes second dies 61, each second die 61 covers at least one of the unit arrays 51, each second die 61 matches in terms of performance with the first dies 51*a* in the unit array 51 that it covers; and providing a third wafer, the third wafer includes third dies 71 and sequentially bonding the first, second and third wafers in this order; each second die 61 covers at least one of the third dies 71, each third die 71 matches in terms of performance with the second die 61 and/or the first dies 51*a*.

The first wafer is provided thereon with first alignment marks, the second wafer is provided thereon with second alignment marks, the first alignment marks correspond to the second alignment marks. The third wafer is provided thereon with third alignment marks, the third alignment marks correspond to the second alignment marks.

In this embodiment, the third and second wafers are adjacently bonded so that, within the coverage of each second die 61, each second die 61 is bonded to several first dies 51*a* on one side and to multiple third dies 71 on the other side, providing a free one-to-multiple design. Even more wafers may be subsequently added, and each two adjacent wafers (e.g., the third and second wafers, the fourth and third wafers) may be designed to match each other. For design for, for example, matching of exposure units and alignment marks including overlay marks and bonding marks in such cases, reference can be made to the above description regarding the design for matching of the first and second wafers, and, therefore, further description thereof is omitted. In this embodiment, bonding multiple wafers together can enhance the performance of bonded (integrated) dies, without worry about mismatching between differently-sizes dies of various functions. Such free die-to-die matching of multiple wafers offers significantly greater design freedom.

Figure 11:
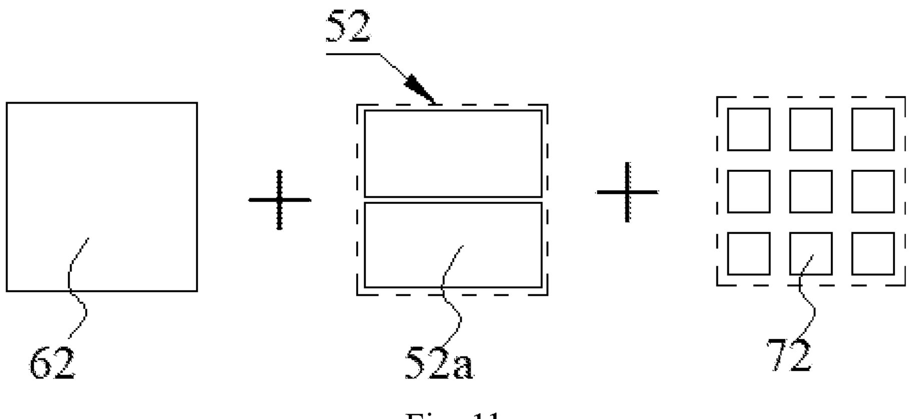
FIG. 11 is a schematic diagram showing a second example of matching three wafers according to an embodiment of the present invention

FIG. 11 is a schematic diagram showing a second example of matching three wafers according to an embodiment of the present invention. As shown in FIG. 11, a method of design for matching of the wafers includes:

providing a first wafer, the first wafer includes unit arrays 52, each unit array 52 includes at least two first dies 52*a*;

providing a second wafer, the second wafer includes second dies 62, each second die 62 covers at least one of the unit arrays 52, the second dies 62 match in terms of performance with the first dies 52*a* in the unit array 52 that it covers; and providing a third wafer, the third wafer includes third dies 72 and sequentially bonding the second, first and third wafers in this order so that each first die 52*a* covers at least one of the third dies 72, the third dies 72 match in terms of performance with the first die 52*a* and/or the second die 62.

The first wafer is provided thereon with first alignment marks, the second wafer is provided thereon with second alignment marks, the first alignment marks correspond to the second alignment marks. The third wafer is provided thereon with third alignment marks corresponding to the first alignment marks.

Subsequent to the sequential bonding of the second, first and third wafers, they are diced into individual bonded units (devices) each including, for example, one of the second dies 62. In each bonded unit (device), electrical connection of the second die 62, the first dies 52*a* and the third dies 72 may be accomplished by two approaches, the first approach: hybrid bonding involving dielectric-dielectric bonding and metal-metal bonding between a metal layer on a bonding surface on one side of the first dies 52*a* and a metal layer on a bonding surface of the second die 62 and hybrid bonding involving dielectric-dielectric bonding and metal-metal bonding between a metal layer on a bonding surface on the other side of the first dies 52*a* and a metal layer on a bonding surface of the third dies 72. The second approach: filling an interconnect layer in through silicon vias (TSVs) extending through the dies in the direction of their thicknesses.

In this embodiment, the third and first wafers are adjacently bonded so that, within the coverage of each second die 62, for example, there are two first dies 52*a* and nine third dies 72, providing a multiple-to-multiple design for the first dies 52*a* and third dies 72. Even more wafers may be subsequently added, and each two adjacent wafers (e.g., the third and first wafers, the fourth and third wafers) may be designed to match each other. For design for, for example, matching of exposure units and alignment marks including overlay marks and bonding marks in such cases, reference can be made to the above description regarding the design for matching of the first and second wafers, and, therefore, further description thereof is omitted. In this embodiment, bonding multiple wafers together can enhance the performance of bonded (integrated) dies, without worry about mismatching between differently-sizes dies of various functions. Such free die-to-die matching of multiple wafers offers significantly greater design freedom.

The present invention further provides a wafer bonding structure, including:

- a first wafer including unit arrays, each unit array including at least two first dies;
- a second wafer including second dies, each second die covering at least one of the unit arrays and matched in terms of performance with the first dies in the unit array that it covers,
- wherein the first wafer is provided thereon with first alignment marks, the second wafer is provided thereon with second alignment marks, the first alignment marks correspond to the second alignment marks, and
- wherein the second wafer is bonded to the first wafer.

In particular, the bonding of the second wafer to the first wafer may be accomplished by van der Waals forces provided by thin films at the bonding interface (e.g., in case of hybrid bonding involving metal-metal bonding and dielectric-dielectric bonding). This can enhance integration of the wafers. Design for matching of wafers to be bonded of different functions (e.g., those containing RF dies, memory dies, control dies, image dies, etc.) can present great advantages in terms of performance, functionality and size.

The first wafer has a number of identical first exposure units, each first exposure unit includes at least one of the unit arrays. The second wafer has a number of identical second exposure units, each second exposure unit includes at least one of the second dies. The first exposure units may be sized either the same as the second exposure units or not. The second dies are, for example, control dies, the first dies are, for example, memory dies.

The present invention further provides a chip bonding structure, including:

- at least one unit array, and the at least one unit array including at least two first dies; and
- at least one second die, and the at least one second die covering the at least one unit array,
- wherein the at least one second die is matched in terms of performance with at least one of the first dies in the at least one unit array that the at least one second die covers, and
- wherein the at least one second die is bonded to the at least one unit array that the at least one second die covers.

In summary, in the wafer matching design method, the wafer bonding structure and the chip bonding structure of the present invention, the first wafer includes unit arrays each including at least two first dies, and the second wafer includes second dies each covering at least one of the unit arrays. Moreover, each second die is matched in terms of performance with the first dies of the unit array that it covers, and the first wafer is provided thereon with first alignment marks, the second wafer is provided thereon with second alignment marks, the first alignment marks correspond to the second alignment marks. With the present invention, two or more wafers with corresponding dies differing considerably in terms of shape or area can be designed to match each other and become suitable to be bonded together. This enables effective area utilization of, and better matching in terms of area and performance between, the first and second dies, greatly shortens the development time of new products and adds great diversity and freedom to product design. The present invention is no longer limited by the requirement that dies to be vertically bonded must be equally sized, enabling more flexible wafer or die bonding (stacking), improving the yield of bonded products and reducing product cost.

The embodiments disclosed herein are described in a progressive manner, with the description of each embodiment focusing on its differences from others. Reference can be made between the embodiments for their identical or similar parts. Since the device embodiments correspond to the method embodiments, they are described relatively briefly, and reference can be made to the method embodiments for details of them.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

The invention claimed is:

1. A method of design for matching of wafers, comprising:

- providing a first wafer comprising at least one unit array, each unit array comprising at least two first dies;
- providing a second wafer comprising at least one second die, each second die covering at least one of the unit array(s), each second die matched in terms of performance with at least one of the first dies in the unit array(s) that the second die covers,
- wherein the first wafer is provided thereon with first alignment marks, the second wafer is provided thereon with second alignment marks, the first alignment marks correspond to the second alignment marks,
- wherein the first wafer comprises a plurality of identical first exposure units, each of the first exposure units comprising at least one of the unit array(s), and wherein the second wafer comprises a plurality of identical second exposure units, each of the second exposure units comprising at least one of the second die(s),
- wherein the first alignment marks include first overlay marks; the second alignment marks include second overlay marks, the first exposure units are sized differently from the second exposure units, wherein some of the second overlay marks in the plurality of second exposure units correspond to some of the first overlay marks in the plurality of first exposure unit periodically or at intervals.

2. The method of design for matching of wafers of claim 1, wherein: the first alignment marks further include first bonding marks; the second alignment marks further include second bonding marks; at least two of the first alignment marks are provided on the first wafer, and at least two of the second alignment marks are provided on the second wafer; and at least two of the second bonding marks correspond to two of the first bonding marks.

3. The method of design for matching of wafers of claim 1, wherein those of the second overlay marks in odd-numbered ones of the second exposure units correspond to those of the first overlay marks in first wafer regions covered by the odd-numbered second exposure units, and wherein the second exposure units are numbered sequentially based on their layout on the first and the second wafer.

4. The method of design for matching of wafers of claim 1, wherein each second die is bonded to the unit array(s) that the second die covers to make up a bonded unit.

5. The method of design for matching of wafers of claim 4, wherein in the bonded unit, the second die is electrically connected to the unit array(s) by bonding a metal layer on a bonding surface of the second die to a metal layer on a bonding surface of the unit array(s).

6. The method of design for matching of wafers of claim 1, wherein in each of the second exposure units, each of the second die(s) covers N of the first dies, where N is an integer greater than or equal to 2.

7. The method of design for matching of wafers of claim 1, wherein each second die is a control die and the first dies are memory dies.

8. The method of design for matching of wafers of claim 1, wherein each second die is provided with a test block.

9. The method of design for matching of wafers of claim 1, further comprising:

providing a third wafer comprising at least one third die, wherein the first wafer, the second wafer and the third wafer are bonded in the sequence set forth, each second die covering at least one of the third die(s), each third die is matched in terms of performance with at least one of the second die(s) and/or at least one of the first dies, wherein the third wafer is provided thereon with third alignment marks corresponding to the second alignment marks.

10. The method of design for matching of wafers of claim 1, further comprising:

providing a third wafer comprising at least one third die, wherein the second wafer, the first wafer and the third wafer are bonded in the sequence set forth, each first die covering at least one of the third die(s), each of which is matched in terms of performance with at least one of the first dies and/or at least one of the second die(s), wherein the third wafer is provided thereon with third alignment marks corresponding to the first alignment marks.

11. A wafer bonding structure, comprising:

a first wafer comprising at least one unit array, each unit array comprising at least two first dies;

a second wafer comprising at least one second die, each second die covering at least one of the unit array(s), and each second die matched in terms of performance with at least one of the first dies in the unit array(s) that the second die covers, wherein the first wafer is provided thereon with first alignment marks and the second wafer is provided thereon with second alignment marks, the first alignment marks corresponding to the second alignment marks, and wherein the second wafer is bonded to the first wafer, wherein the first wafer comprises a plurality of identical first exposure units, each of the first exposure units comprising at least one of the unit array(s), and wherein the second wafer comprises a plurality of identical second exposure units, each of the second exposure units comprising at least one of the second die(s), wherein the first alignment marks include first overlay marks; the second alignment marks include second overlay marks, the first exposure units are sized differently from the second exposure units, wherein some of the second overlay marks in the plurality of second exposure units correspond to some of the first overlay marks in the plurality of first exposure unit periodically or at intervals.

* * * * *